(12) United States Patent
Hall et al.

(10) Patent No.: US 7,306,999 B2
(45) Date of Patent: Dec. 11, 2007

(54) HIGH VOLTAGE SENSOR DEVICE AND METHOD THEREFOR

(75) Inventors: Jefferson W. Hall, Chandler, AZ (US); Mohammed Tanvir Quddus, Chandler, AZ (US)

(73) Assignee: Semiconductor Components Industries, L.L.C., Phoenix, AZ (US)

( * ) Notice: Subject to any disclaimer, the term of this patent is extended or adjusted under 35 U.S.C. 154(b) by 0 days.

(21) Appl. No.: 11/041,710

(22) Filed: Jan. 25, 2005

(65) Prior Publication Data

US 2006/0163691 A1    Jul. 27, 2006

(51) Int. Cl.
*H01L 21/8222* (2006.01)
(52) U.S. Cl. ............... 438/329; 438/382; 257/528; 257/536; 257/E21.004
(58) Field of Classification Search ............... 438/329, 438/328, 330, 210, 382; 257/528, 536, E21.004
See application file for complete search history.

(56) References Cited

U.S. PATENT DOCUMENTS

| | | | |
|---|---|---|---|
| 4,792,840 A | 12/1988 | Nadd | |
| 5,053,743 A | 10/1991 | Mille et al. | |
| 5,063,307 A * | 11/1991 | Zommer | 324/512 |
| 5,477,175 A * | 12/1995 | Tisinger et al. | 327/143 |
| 5,498,899 A | 3/1996 | Palara | |
| 6,023,092 A * | 2/2000 | Tung | 257/547 |
| 6,222,247 B1 | 4/2001 | Tung | |
| 6,356,464 B1 | 3/2002 | Balakrishnan et al. | |
| 6,509,784 B2 | 1/2003 | Seinen et al. | |
| 6,680,515 B1 | 1/2004 | Hsing | |
| 6,989,566 B2 * | 1/2006 | Noda et al. | 257/339 |

* cited by examiner

*Primary Examiner*—Andy Huynh
(74) *Attorney, Agent, or Firm*—Robert F. Hightower (57) ABSTRACT

In one embodiment, a high voltage element is formed overlying a doped semiconductor region that can be depleted during the operation of the high voltage element.

22 Claims, 5 Drawing Sheets

HIGH VOLTAGE SENSOR DEVICE AND METHOD THEREFOR

BACKGROUND OF THE INVENTION

The present invention relates, in general, to electronics, and more particularly, to methods of forming semiconductor devices and structure.

In the past, the semiconductor industry utilized various methods to form semiconductor devices for controlling high voltage systems. One example of such a high voltage system was a power supply controller that operated from input voltages having high voltage values. One problem with these prior semiconductor devices was an inability to sense the value of the high voltage in a continuous manner. Typically, external circuits were utilized to provide voltages that were representative of the value of the high voltage. For example, a controller may operate from an input voltage of several hundred volts and the value of this voltage may change with respect to time. In order to provide efficient operation, the controller may need to sense the value of this voltage as it changes during the operation of the controller. The inability to produce devices on a semiconductor chip that could be used to sense the value of the high voltage resulted in using the external components which increased the cost of the system.

Accordingly, it is desirable to have a semiconductor device that can sense the value of a high voltage signal.

For simplicity and clarity of illustration, elements in the figures are not necessarily to scale, and the same reference numbers in different figures denote the same elements. Additionally, descriptions and details of well-known steps and elements are omitted for simplicity of the description. As used herein current carrying electrode means an element of a device that carries current through the device such as a source or a drain of an MOS transistor or an emitter or a collector of a bipolar transistor or a cathode or anode of a diode, and a control electrode means an element of the device that controls current through the device such as a gate of an MOS transistor or a base of a bipolar transistor. Although the devices are explained herein as certain N-channel or P-Channel devices, a person of ordinary skill in the art will appreciate that complementary devices are also possible in accordance with the present invention. For clarity of the drawings, doped regions of device structures are illustrated as having generally straight line edges and precise angular corners. However, those skilled in the art understand that due to the diffusion and activation of dopants the edges of doped regions are generally not straight lines and the corners are not precise angles.

DETAILED DESCRIPTION OF THE DRAWINGS

Figure 1:
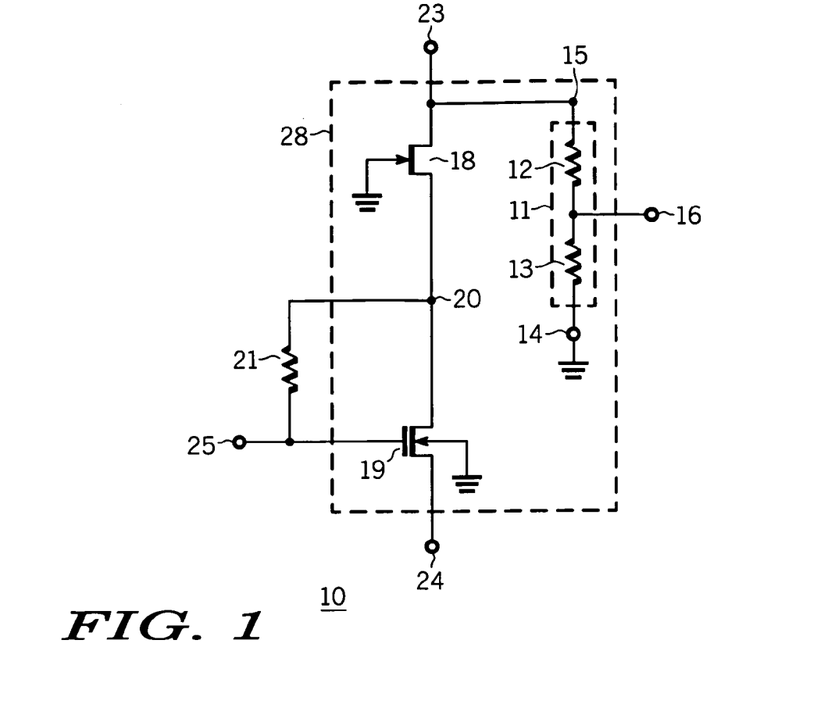
FIG. 1 schematically illustrates a circuit diagram of an embodiment of a portion of a high voltage semiconductor device in accordance with the present invention.

FIG. 1 schematically illustrates a circuit diagram of a preferred embodiment of a portion of a high voltage semiconductor device 10 that forms a low voltage sense signal that is representative of an input voltage that has a high voltage value. Device 10 includes a high voltage sense element 11 that receives the high voltage and forms the sense signal on a sense output 16 that is representative of the high voltage. As the value of the input voltage varies, the sense signal also varies. Device 10 also is formed to provide a first output current on a current output 24 in response to control signals applied to a control input 25.

In one embodiment, element 11 is a portion of a high voltage transistor and sense device 28 of device 10 that is formed as a merged transistor including a JFET transistor 18 and a metal oxide semiconductor (MOS) transistor 19. Device 10 may also include a bias resistor 21 that is formed to provide bias currents to the gate of transistor 19. Transistors such as transistors 18 and 19 of device 28 are well known to those skilled in the art. One example of a device similar to transistors 18 and 19 is disclosed in U.S. Pat. No. 5,477,175 issued to Tisinger et al on Dec. 19, 1995 which is hereby incorporated herein by reference. In other embodiments, transistor 19 may be other transistors structures such as a J-FET or a bipolar transistor. In other embodiments, resistor 21 may be other structures such as a JEFT. Device 10 is formed to receive the input voltage on a high voltage input 23 and generate the sense signal on output 16.

In the past, it was difficult to sense the value of a high voltage on a semiconductor device. For example, in some applications for world wide line voltage applications, the input voltage may exceed four hundred volts (400 V) and in some cases could be as high as seven hundred volts (700 V). For example, flyback voltages of transformers used in power supply systems can increase a four hundred volt input voltage to seven hundred volts.

As will be seen further hereinafter, element 11 is formed in a manner that facilitates receiving such a high input voltage and responsively forming the sense signal. In one embodiment, element 11 is a resistor divider that is connected between input 23 and the lowest voltage applied to the semiconductor device that incorporates element 11. Typically, the lowest voltage is a ground reference although other values may be used. The resistor divider includes a first resistor 12 connected in series with a second resistor 13 with the sense signal formed at a common node at the common connection between the resistors. Only one terminal of resistor 12 is connected to a current carrying electrode or terminal of either of transistors 18 and 19. The other terminal or low voltage terminal of resistor 12 is not connected to transistors 18 and 19 but is connected to output 16 to facilitate a device receiving the sense signal. Additionally, neither terminal of resistor 13 is connected to a current carrying electrode of transistors 18 and 19. Thus, a low voltage terminal of element 11 is not connected to high voltage device 28 and transistors 18 and 19. Having only one terminal connected to device 28 and transistors 18 and 19 assists in ensuring that the sense signal has a low voltage. The value of resistors 12 and 13 are selected to be large in order to minimize the power dissipated by element 11. In one example embodiment, the total resistance of the series combination of resistors 12 and 13 typically is no less than about fifteen (15) meg-ohms but may be other values in other embodiments.

In order to assist in providing the functionality of device 10, a drain of transistor 18 is commonly connected to input 23 and to a first terminal 15 of element 11. A first terminal of resistor 12 is connected to terminal 15 and a low voltage terminal of resistor 12 is connected to output 16. A connection terminal 14 of element 11 is connected to the lowest voltage of device 28. A first terminal of resistor 13 is connected to output 16 and a second terminal is connected to terminal 14. A source of transistor 18 is connected to a common node 20 and to a drain of transistor 19. A gate of transistor 19 is connected to input 25 and to a first terminal of resistor 21, and a source is connected to output 24. A second terminal of resistor 21 is connected to node 20. The gate connection of transistor 18 will be explained in more detail in the description of FIG. 2.

Figure 2:
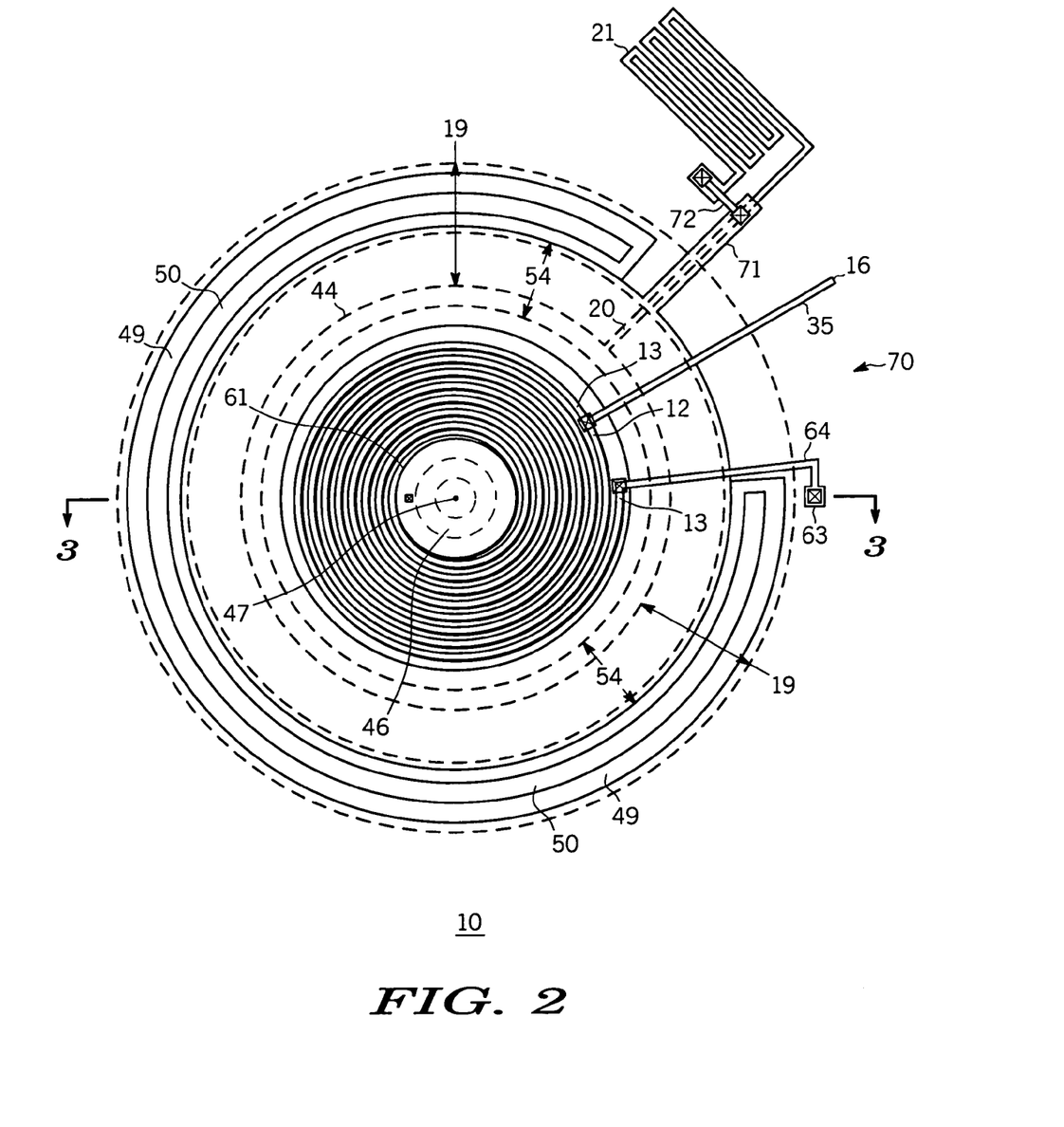
FIG. 2 illustrates an enlarged plan view of an embodiment of a portion of the semiconductor device of FIG. 1 in accordance with the present invention.
Figure 3:
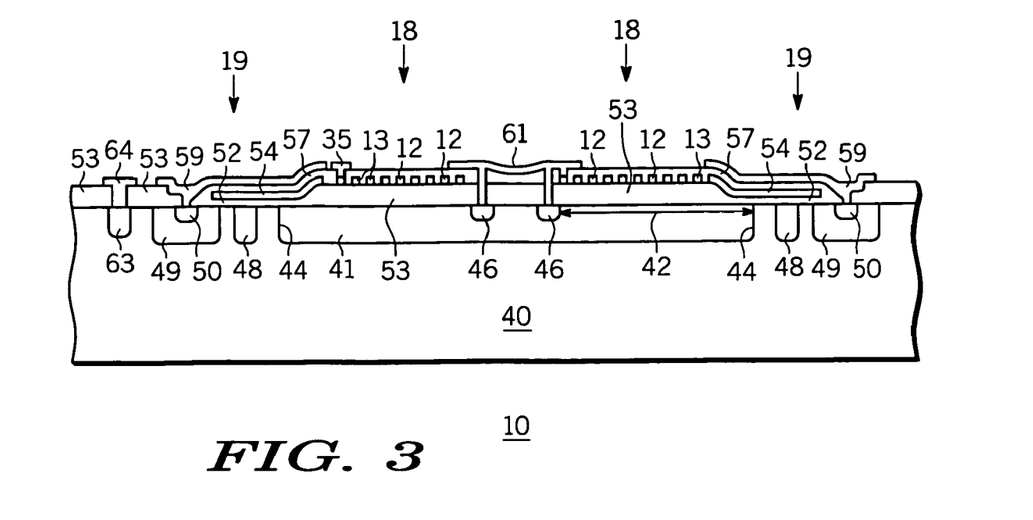
FIG. 3 illustrates a cross-sectional portion of the embodiment of the semiconductor device of FIG. 2 accordance with the present invention.

FIG. 2 illustrates an enlarged plan view of a portion of an embodiment of device 10 explained in the description of FIG. 1. FIG. 3 illustrates an enlarged cross-sectional portion of device 10 illustrated in FIG. 2 along section line 3-3. This description has references to both FIG. 2 and FIG. 3. Resistors 12 and 13 of element 11 are formed to overly a portion of J-FET 18 that is substantially depleted of carriers during high voltage operation of transistor 18. The depleted portion of transistor 18 allows element 11 to withstand the high voltage that is applied to device 10 and form the sense signal on output 16.

Transistor 19 is identified in general by an arrow and dashed lines in FIG. 2. Transistors 18 and 19 generally are formed as closed geometric shapes on a surface of a semiconductor substrate 40. Typically the closed geometric shapes have centers that are concentric and have some overlapping periphery. In the preferred embodiment, the closed geometric shapes are formed as circles or arcs of circles having various concentric radii. For clarity of the explanation, the preferred embodiment is explained, however, those skilled in the art will realize that other closed shapes such as ellipses, squares, pentagons, hexagons, interdigitated fingers, etc. may also be used instead of circles and that transistors 18 and 19 may have different lengths and widths.

In the preferred embodiment, the closed geometric shapes of transistor 18 are formed as concentric circles that have increasing radii. A first portion of the geometric shapes of transistor 19 are formed as a circle and a second portion are formed as arcs of a circle with the arcs having radii that are larger than radii of the circle portion of transistor 18. A circular shaped doped region 41 is formed on a surface of a substrate 40. In the preferred embodiment the doping profile of region 41 is not a graded profile that has multiple doping zones but is substantially constant across region 41. Such a non-graded doping profile simplifies manufacturing and reduces manufacturing costs. It will be understood that the doping concentration may vary some due to depth and normal longitudinal variations but the doping profile is not formed to vary from a high concentration at one position substantially progressively toward a lower doping at a second position. Region 41 has an opposite doping type than substrate 40. Preferably, substrate 40 is P-type and has a resistivity of approximately eighty (80) Ohm-cm, and region 41 is N-type with a doping concentration of approximately $1E15$ cm$^{-3}$ to $2E15$ cm$^{-3}$. Region 41 typically is about seven to eight (7-8) microns thick. Portions of region 41 form a portion of both transistors 18 and 19. A drain contact 46 of transistor 18 is formed as a doped region on the surface of substrate 40 and within region 41. Contact 46 is shaped as a hollow first circle having a first radius and a center 47. Contact 46 is formed concentric with region 41 and with a radius that is smaller than the radius of region 41. Because of the hollow circle shape of contact 46, a first circular shaped inner portion of region 41 underlies contact 46 (see FIG. 3). This first portion forms the drain region of transistor 18. A second circular portion 42 of region 41 extends from the outer circumference of contact 46 to an outer edge 44 of region 41 and forms the channel of transistor 18. The interface of substrate 40 with region 41 functions as the gate of J-FET transistor 18. A third portion of region 41 adjacent to edge 44 and underlying at least a portion of gate conductor 54 generally is regarded as both the source of transistor 18 and the drain of transistor 19. Typically substrate 40, and thus the gate of transistor 18, is connected to the lowest potential in the circuit that uses device 10. Thus the drain and source of transistor 18 are formed as closed geometric shapes with the source having a radius that is larger than the drain. Also, one doped region is used to form the source and drain of transistor 18 and the drain of transistor 19.

A source region 49 of transistor 19 is formed as a doped region on the surface of substrate 40 as an arc of a circle having a larger radius than the radius of the drain of transistor 19. Typically, an inner portion of source region 49 underlies gate conductor 54. A doped region is formed within source region 49 to function as a source contact 50 of transistor 19. Note that source region 49 and contact 50 are discontinuous at a tap opening 70 of device 10 (See FIG. 2), thus, region 49 and contact 50 are an arc of a circle. A contact region 63 is formed as a doped region in substrate 40 external to transistors 18 and 19. Contact region 63 is used to connect one end or terminal of resistor 13 to substrate 40. A body region 48 of transistor 19 is formed as a doped region on the surface of substrate 40 underlying gate conductor 54. Preferably, substrate 40, body region 48, and contact region 63 are P-type material, and region 41, source region 49, and contact 50 are N-type material in order to form transistor 18 as an N-channel J-FET and transistor 19 as N-channel MOS transistors.

A gate insulator 52 is formed on substrate 40 overlying region 48 and at least an inner edge of region 49. Typically, insulator 52 is thin silicon dioxide, generally no greater than about fifty to sixty (50-60) nano-meters, in order to facilitate operation of transistor 19. A thicker insulator 53 is formed on substrate 40 overlying portion 42 and underlying contact 61. Typically, contact 61 is connected to terminal 23 of FIG. 1. Insulator 53 generally is at least about ten to thirty (10-30) times thicker than insulator 52 in order to assist in providing a high breakdown voltage between resistors 12 and 13 and the underlying silicon structure. Insulator 53 generally is no less than about one to two (1-2) microns thick. Gate conductor 54 is formed to overlie at least a portion of insulator 52. As conductor 54 is formed, the material used for conductor 54 is also formed on insulator 53 and then patterned to form a spiral pattern as illustrated in FIGS. 2 and 3. The spiral pattern forms resistors 12 and 13. Typically, the material used for conductor 54 is polysilicon. The portion of the polysilicon used to form resistors 12 and 13 may be doped differently or the same as conductor 54 to provide a resistivity that provides the desired values for resistors 12 and 13, and for conductor 54. In one embodiment, the polysilicon used for resistors 12 and 13 has a sheet resistance of no less than about twenty ohms/sq. Alternately, the material used for resistors 12 and 13 can be formed separately from conductor 54. The spiral pattern is formed to make as many revolutions as possible around center 47 in order to provide a high resistance for resistors 12 and 13. Using at least a minimum spacing between adjacent portions of the spiral pattern reduces the electric field between the adjacent portions of the pattern. In one exemplary embodiment, the spiral pattern has about thirty five (35) revolutions. Typically the spacing between adjacent revolutions of the spiral pattern is about one to two (1-2) microns. Other patterns can be used to form resistors 12 and 13. For example the pattern can be shaped as ellipses, squares, pentagons, hexagons, etc. especially if the underlying region 41 has such a shape. Another insulator 57, such as an inter-layer dielectric, is applied to cover resistors 12 and 13, conductor 54, and portions of substrate 40 that are external to transistors 18 and 19. Using the minimum spacing between adjacent portions of the spiral pattern also reduces the lateral electric field across insulator 57 that separates the adjacent portions of the spiral pattern thereby reducing the possibility of breakdown and increasing the value of the voltage that can be sensed by element 11. It should be noted that insulator 57 is not illustrated in FIG. 2 for clarity of the drawings. A conductor 35 is formed through an opening in insulator 57 to electrically contact the spiral pattern and form the pattern into resistor 12 and 13. Another conductor 64 is formed through another opening in insulator 57 to electrically contact the distal end of the spiral and to connect one end or terminal of resistor 13 to substrate 40 through contact region 63. Another conductor 59 is formed through an opening in insulator 57 overlying contact 50 to form electrical contact thereto to form a source conductor of device 10. Contact 61 may be formed as part of forming conductors 35, 59, and 64 or may be formed subsequently. It should be noted that conductor 59 is not illustrated in FIG. 2 for clarity of the drawings.

Referring to FIG. 2, at the place where one of the revolutions of the spiral of element 11 passes opening 70, a conductor 35 is formed to extend over conductor 54 and out through opening 70 to form output 16. Output 16 can then be connected to other electrical elements (not shown) that are formed on substrate 40 such as an operational amplifier or a comparator. Conductor 35 extends out past the outside of transistor 19 to facilitate forming electrical contact to elements external to device 10. Conductor 64 is formed to electrically contact the distal end of the spiral and to connect one end or terminal of resistor 13 to substrate 40 through contact region 63 (FIG. 3). A portion of gate conductor 54 is formed to also extend through opening 70 and form a tab 71 that facilitates making contact to gate conductor 54. Resistor 21 is formed as a doped region on the surface of substrate 40 external to device 28. One end of resistor 21 extends under tab 71, illustrated by dashed lines, to make electrical contact to region 41 at edge 44 and at node 20. A second end of resistor 21 is connected to tab 71 by a metal connection 72. A portion of region 48 extends through opening 70 to facilitate forming contact to region 48. For clarity of the drawings, the extension of region 48 through opening 70 is not shown.

In operation, the J-FET functionality of transistor 18 acts to evenly distribute the high voltage electric field that is imposed between the drain and source of transistor 18 throughout region 41 and particularly region 42. Consequently, the impact of the high voltage electric field on resistors 12 and 13 is negligible in both the on or off states of transistor 18. The converse is also true. The evenly distributed potential throughout resistors 12 and 13 has negligible impact on the underlying doped regions of transistor 18. Substrate 40 typically is connected to the lowest voltage in the system that uses device 10. When the high input voltage is applied to input 23, the large voltage difference between substrate 40 and region 41 causes transistor 18 to substantially deplete of carriers. Such depletion will exist both in substrate 40 and portion 42 of transistor 18. The potential across portion 42 as a result of the high input voltage will generally cause region 42 to be substantially depleted and transistor 18 will operate in the pinch-off mode. The doping concentrations of substrate 40 and region 41 are selected to be low enough to provide the substantial depletion at the voltages that are applied to input 23. In most embodiments, a voltage of greater than about five volts (5 V), typically greater than about forty to fifty volts (40V-50V), is applied to input 23 and preferably about four hundred to seven hundred volts (400-700 V) is applied. The combined depletion effects of substrate 40 and region 42 can easily support such high voltages simply by extending their depletion widths without exceeding the critical electric field of silicon which is about 0.3 MV/cm.

The vertical voltage potential between element 11 and the top surface of underlying region 42 at any given location is mainly supported by the thickness of insulator 53 although a small portion of the vertical voltage may be supported by the material used for element 11. Since a high voltage is applied to region 42 and a high voltage is also applied to one terminal of resistor 12, only a moderate difference between these voltages remains to be supported vertically across insulator 53 and element 11. The thickness of insulator 53 sustains the majority of the vertical voltage while retaining the electric field much lower than the breakdown field of the material of insulator 53. Typically the material is silicon dioxide and the resulting breakdown field of the material is about 10 MV/cm. Only a small portion of the vertical voltage is typically supported by element 11 due to the low resistivity of the material. The material typically is doped polysilicon that has a doping concentration no less than about $1 \times 10^{18}$ to $1 \times 10^{19}$ atoms/cm$^3$. For example, the vertical voltage across element 11 and insulator 53 may be about sixty to seventy volts (60-70V) for an applied voltage of about seven hundred volts (700V) at input 23. Generally less than about one volt of this sixty to seventy volt vertical voltage is dropped vertically across element 11 and the remainder is dropped across insulator 53. Generally, the voltage potential of each point on the pattern of resistors 12 and 13 and at a corresponding point of underlying region 42 will almost track each other in potential. This assists in minimizing the value of the vertical electric field therebetween. The value of the vertical voltage that can be sustained can be changed by adjusting the position of the two ends of resistor 11 on insulator 53 relative to the portions of transistor 18 such as contact 46 and edge 44. Since at least portion 42 is substantially depleted of carriers, region 41 provides isolation between substrate 40 and element 11. Consequently, the high electric field does not cause breakdown to substrate 40. Thus, region 41 and insulator 53 assist in the operation of element 11. Those skilled in the art will realize that all carriers are not depleted from portion 42 under all operating conditions, but that most of the carriers are depleted and under such conditions the region is referred to as a region that is depleted of carriers or a depletion region or substantially depleted of carriers. Those skilled in the art also realize that element 11 and associated resistors 12 and 13 may be formed to overlie other such depletion regions and not just a depletion region of a J-FET.

Figure 4:
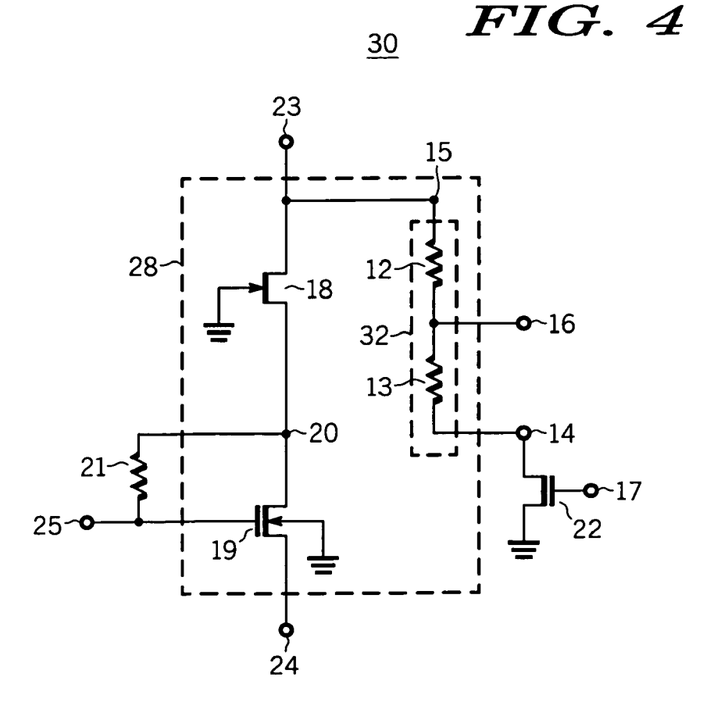
FIG. 4 schematically illustrates a circuit diagram of another embodiment of a portion of a high voltage semiconductor device in accordance with the present invention.

FIG. 4 schematically illustrates a circuit diagram of an embodiment of a device 30 that is an alternate embodiment of device 10 of FIG. 1. Device 30 includes a high voltage sense element 32 that is an alternate embodiment of element 11. Element 32 receives the high voltage and forms the sense signal on sense output 16. One terminal of resistor 13 extends outside of the active area of device 28 and forms a connection terminal 14. Device 30 includes a power saving switch 22 that is used to selectively switch terminal 14 to the lowest voltage that is applied to element 32. Switch 22 includes a switch control input 17 that is used to enable or disable switch 22. For example, switch 22 can be enabled periodically to form the sense signal on output 16 and then disabled after the value of the sense signal has been used. Disabling switch 22 reduces the amount of power dissipated by element 32 and still allows element 32 to form the sense signal similarly to element 11.

Figure 5:
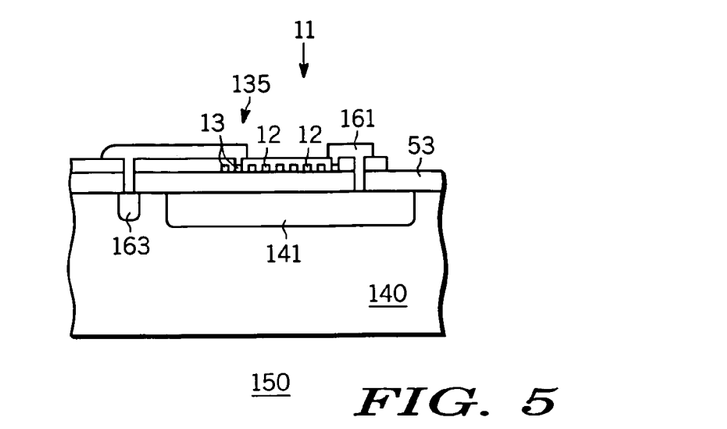
FIG. 5 illustrates a an enlarged cross-sectional portion of another embodiment of a high voltage semiconductor device in accordance with the present invention.

FIG. 5 illustrates an enlarged cross-sectional view of an embodiment of a portion of a semiconductor device 150 that includes element 11. Device 150 is formed on a semiconductor substrate 140 that is similar to substrate 40 of FIGS. 2 and 3. A doped region 141 is formed on a surface of substrate 140. The doping and isolation characteristics of region 141 are similar to region 41. A contact 161 is formed to receive the high input voltage. Contact 161 is also formed to contact one terminal of resistor 12 and to provide a connection to region 141. Thus, the high voltage received by contact 161 is applied to region 141. A contact region 163 is formed in substrate 140 similarly to region 63. A second end or terminal of resistor 13 is extended across insulator 53 to make electrical contact to region 163. Similarly to element 11, region 141 and insulator 53 are a portion of element 32. Device 150 can be part of a pulse width modulated (PWM) power supply controller or other type of device that may utilize element 11 to sense the continuously variable value of a high voltage signal.

Figure 6:
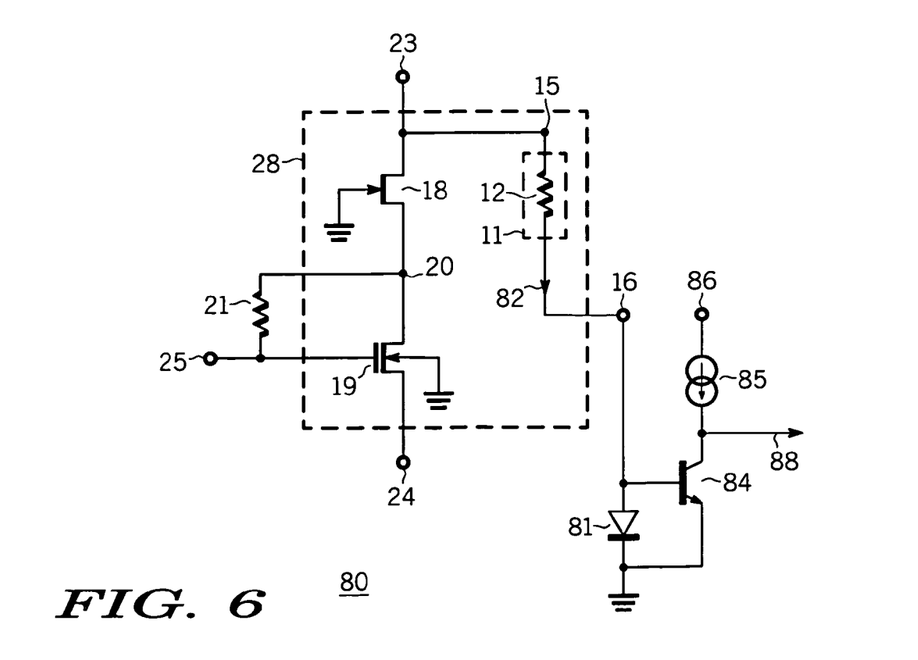
FIG. 6 schematically illustrates a circuit diagram of an embodiment of a portion of a high voltage semiconductor device that is an alternate embodiment of the device of FIG. 1 in accordance with the present invention.

FIG. 6 schematically illustrates a circuit diagram of an embodiment of a portion of a high voltage semiconductor device 80 that is an alternate embodiment of device 10. Element 11 includes resistor 12 but omits resistor 13. One terminal of resistor 12 is connected to receive the high input voltage and a second terminal is connected to output 16 to supply the low voltage sense signal. Similar to device 10, the value of resistor 12 is selected to be large in order to minimize the power dissipated by element 11 and typically is no less than about fifteen (15) meg-ohms.

Device 80 also includes a current mirror configured to receive the sense signal and responsively form an output voltage on an output 88 that is representative of the high input voltage received on input 23. The current mirror includes a clamp diode 81, a comparator transistor 84, and a current source 85. Output 88 is formed by the connection of transistor 84 and current source 85. Diode 81 clamps the voltage on the low voltage terminal of resistor 12 and at the base of transistor 84 to a fixed voltage. Terminal 86 of the current mirror generally is connected to receive an operating voltage that is derived from the voltage on output 24. As the value of the voltage on input 23 increases, the value of a current 82 that flows through resistor 12 also increases. The increase in current 82 enables transistor 84 to conduct more current and reduces the voltage on output 88. Thus, as the value of the high input voltage on input 23 increases, the value of the sense signal on output 88 responsively decreases and functions as a comparator output that switches states when the current through resistor 12 becomes more than the current in current source 85. It will be appreciated that source 85 may be replaced by a resistor and that output 88 would then generate an analog voltage representative of a value of the voltage received on input 23.

Figure 7:
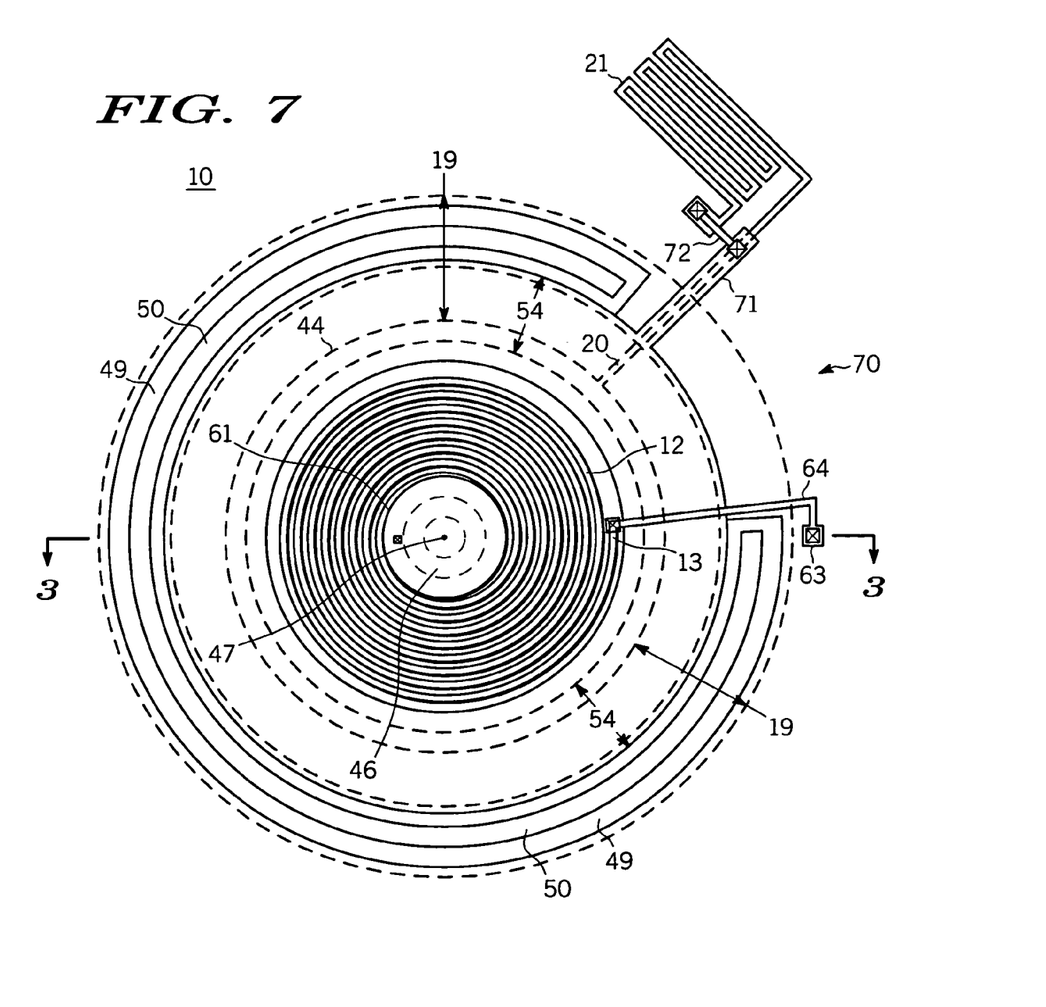
FIG. 7 illustrates an enlarged plan view of a portion of an embodiment of the high voltage semiconductor device of FIG. 6 in accordance with the present invention.

FIG. 7 illustrates an enlarged plan view of a portion of an embodiment of device 80 explained in the description of FIG. 6. This description has references to both FIG. 6 and FIG. 7. The portion of device 80 illustrated in FIG. 7 omits the current mirror of device 80. Similarly to device 10, resistor 12 is formed to overly a portion of J-FET 18 that is substantially depleted of carriers during the operation of transistor 18. Since resistor 13 is omitted from device 80, the pattern of resistor 12 typically is extended to include the pattern used for resistor 13 in FIG. 2 and FIG. 3. Note that one terminal of resistor 12 is connected to receive the high input voltage from input 23 and the other terminal of resistor 12 is connected to output 16 and not connected to a current carrying electrode of transistor 18 or 19.

Figure 8:
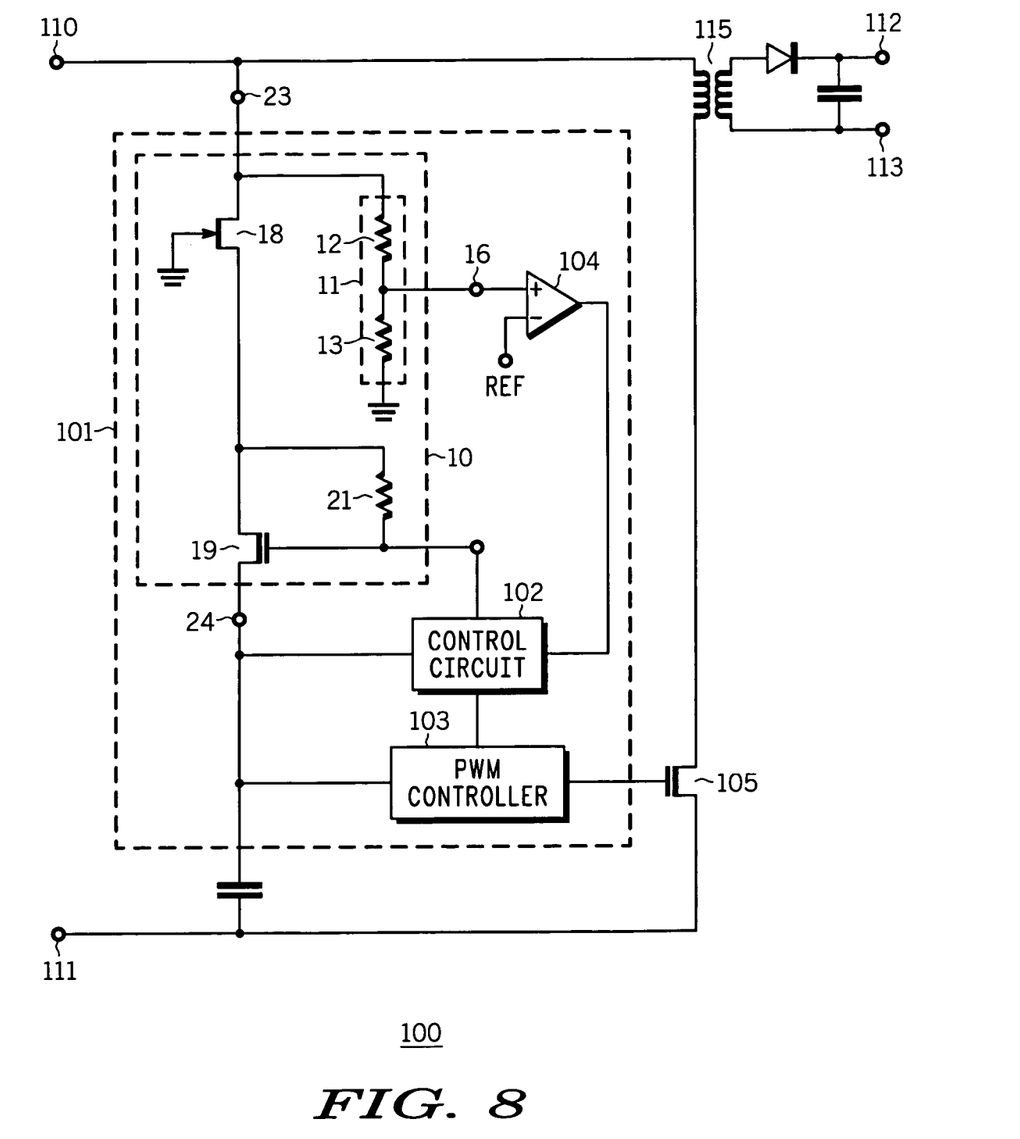
FIG. 8 schematically illustrates a circuit diagram of an embodiment of a portion of a system using the high voltage semiconductor device of FIG. 1 in accordance with the present invention.

FIG. 8 schematically illustrates a portion of an embodiment of a power supply control system 100 that utilizes device 10 to regulate the value of an output voltage of system 100. System 100 receives a bulk input voltage between input terminals 110 and 111 and controls a power switch 105 to provide an output voltage between output terminals 112 and 113. Device 10 receives the bulk voltage on input 23 and provides the sense signal on output 16. A power supply control system 101 of system 100 has a PWM controller 103, a control circuit 102, and device 10. Device 10 is also used to provide a start-up voltage for operating controller 103 and circuit 102. An amplifier 104 receives the sense signal, amplifies it. Circuit 102 receives the amplified sense signal and processes it to provide control functionality for controller 103. The control functionality could include, among other functions, line under-voltage detection and shutdown, line over-voltage detection and shutdown, input power determination and limitation, line feed-forward for current mode ramp compensation, power limiting, and/or standby operation. Those skilled in the art will appreciate that devices 30, 80, or 150 could also be used instead of device 10.

In another embodiment, node 23 may be connected to the drain of switch 105 instead of input 110 and the amplified sense signal could be used by control circuit 102 to regulate the output voltage as a function of the transformer flyback voltage when switch 105 is not conducting. Control circuit 102 could also sense the flyback voltage when switch 105 is not conducting to determine whether or not any energy remains in the transformer at some point in time.

In view of all of the above, it is evident that a novel device, method of forming the device, and method of using the device is disclosed. Included, among other features, is forming a high voltage element overlying a doped region that can be substantially depleted of carriers during the operation of the high voltage element. Also included is forming the high voltage element overlying a thick insulator, such as a field oxide, that is overlying a portion of the doped region. The word "connected" is used throughout for clarity of the description, however, it is intended to have the same meaning as the word "coupled". Accordingly, "connected" should be interpreted as including either a direct connection or an indirect connection.

The invention claimed is:

1. A method of forming a high voltage sensing element comprising:

providing a substrate of a first semiconductor material having a first conductivity type;

forming a first doped region of a second conductivity type on a first portion of the substrate including forming the first doped region to operably receive an input voltage;

forming an MOS transistor;

forming an insulator overlying a portion of the first doped region wherein the insulator has a first thickness that is greater than a second thickness of a gate insulator of the MOS transistor; and forming a first resistor overlying the insulator wherein a first terminal of the first resistor is coupled to the first doped region.

2. The method of claim 1 further including electrically coupling a first terminal of the first resistor to the substrate.

3. The method of claim 2 wherein electrically coupling the first terminal of the first resistor to the substrate includes coupling a switch between the first terminal of the first resistor and the substrate in order to couple the first terminal to the substrate.

4. The method of claim 1 further including forming a second resistor overlying the insulator and coupling a first terminal of the second resistor to a second terminal of the first resistor at a common node.

5. The method of claim 4 wherein forming the second resistor includes coupling the common node to another electrical element that is formed on the substrate.

6. The method of claim 1 wherein forming the insulator overlying the first doped region includes forming the gate insulator to be no greater than about two hundred nano meters.

7. The method of claim 1 wherein forming the insulator overlying the first doped region includes forming the first thickness about two to one hundred times greater than the second thickness.

8. The method of claim 1 wherein forming the first doped region includes forming the first doped region with a non-graded doping profile.

9. The method of claim 1 wherein forming the first resistor includes coupling a second terminal of the first resistor to an input of a current mirror.

10. The method of claim 1 wherein forming the first doped region includes forming a first portion of the first doped region as a channel region of a J-FET.

11. The method of claim 10 wherein forming the first doped region includes forming a second portion of the first doped region as a drain region of the MOS transistor.

12. A method of forming a high voltage element of a semiconductor device comprising:

providing a substrate of a first semiconductor material having a first conductivity type;

forming a first doped region of a second conductivity type on a first portion of the substrate;

forming an insulator overlying at least a portion of the first doped region wherein the insulator has a first thickness;

forming a first resistor overlying the insulator;

coupling a first terminal of the first resistor to receive a signal representative of a signal applied to the first doped region; and coupling a second terminal of the first resistor to a circuit external to the high voltage element and not connected directly to the high voltage element.

13. The method of claim 12 wherein coupling the first terminal of the first resistor to receive the signal representative of the signal applied to the first doped region includes coupling the first terminal of the first resistor to receive a high voltage that is greater than five volts.

14. The method of claim 12 further including forming a second resistor and coupling a first terminal of the second resistor to the first terminal of the first resistor.

15. The method of claim 14 further including coupling a second terminal of the second resistor to the substrate externally to the high voltage element.

16. The method of claim 12 wherein forming the first doped region includes forming the first doped region having a non-graded doping profile.

17. The method of claim 12 wherein forming the first doped region includes forming a portion of the first doped region as a current carrying electrode of a transistor wherein the second terminal of the first resistor is not coupled to either a current carrying electrode or a control electrode of the transistor.

18. A method of forming a high voltage element of a semiconductor device comprising:

providing a substrate of a first semiconductor material having a first conductivity type;

forming a first doped region of a second conductivity type on a first portion of the substrate;

forming an insulator overlying at least a portion of the first doped region wherein the insulator has a first thickness;

forming a first resistor of overlying at least a first portion of the insulator; and coupling a first terminal of the first resistor to the substrate.

19. The method of claim 18 further including coupling a second terminal of the first resistor to a second resistor of a resistor divider wherein the second resistor is overlying at least a second portion of the insulator.

20. The method of claim 18 including forming the insulator having a thickness that is greater than a thickness of a gate insulator of an MOS transistor that is formed on the substrate.

21. A method of forming a high voltage element of a semiconductor device comprising:

providing a substrate of a first semiconductor material having a first conductivity type;

forming a transistor on a first portion of the substrate;

forming an insulator overlying at least a first portion of an active region of the transistor; and forming a first resistor overlying at least a first portion of the active region of the transistor and overlying the insulator wherein a first terminal of the first resistor is not coupled to the transistor.

22. The method of claim 21 wherein forming the transistor includes forming a J-FET.

* * * * *

UNITED STATES PATENT AND TRADEMARK OFFICE
CERTIFICATE OF CORRECTION

PATENT NO.       : 7,306,999 B2                                        Page 1 of 4
APPLICATION NO.  : 11/041710
DATED            : December 11, 2007
INVENTOR(S)      : Jefferson W. Hall et al.

It is certified that error appears in the above-identified patent and that said Letters Patent is hereby corrected as shown below:

The title page, showing the illustrated figure 3 should be deleted to appear as per attached title page.

The sheets of drawings consisting of figures 3, 5 and 7 should be deleted to appear as per attached figures.

In column 2, line 40, please change "JEFT" to --J-FET--.

In column 5, line 5, please change "twenty ohms/sq." to --two thousand ohms/sq.--.

Signed and Sealed this

Nineteenth Day of January, 2010

David J. Kappos
*Director of the United States Patent and Trademark Office*

United States Patent
Hall et al.

(12) 
(10) Patent No.: US 7,306,999 B2
(45) Date of Patent: Dec. 11, 2007

(54) HIGH VOLTAGE SENSOR DEVICE AND METHOD THEREFOR

(75) Inventors: Jefferson W. Hall, Chandler, AZ (US); Mohammed Tanvir Quddus, Chandler, AZ (US)

(73) Assignee: Semiconductor Components Industries, L.L.C., Phoenix, AZ (US)

( * ) Notice: Subject to any disclaimer, the term of this patent is extended or adjusted under 35 U.S.C. 154(b) by 0 days.

(21) Appl. No.: 11/041,710

(22) Filed: Jan. 25, 2005

(65) Prior Publication Data
US 2006/0163691 A1 Jul. 27, 2006

(51) Int. Cl.
*H01L 21/8222* (2006.01)
(52) U.S. Cl. ............... 438/329; 438/382; 257/528; 257/536; 257/E21.004
(58) Field of Classification Search .......... 438/329, 438/328, 330, 210, 382; 257/528, 536, E21.004
See application file for complete search history.

(56) References Cited

U.S. PATENT DOCUMENTS

| 4,792,840 | A | | 12/1988 | Nadd | |
| 5,053,743 | A | | 10/1991 | Mille et al. | |
| 5,063,307 | A | * | 11/1991 | Zommer | 324/512 |
| 5,477,175 | A | * | 12/1995 | Tisinger et al. | 327/143 |
| 5,498,899 | A | | 3/1996 | Palara | |
| 6,023,092 | A | * | 2/2000 | Tung | 257/547 |
| 6,222,247 | B1 | | 4/2001 | Tung | |
| 6,356,464 | B1 | | 3/2002 | Balakrishnan et al. | |
| 6,509,784 | B2 | | 1/2003 | Seinen et al. | |
| 6,680,515 | B1 | | 1/2004 | Using | |
| 6,989,566 | B2 | * | 1/2006 | Noda et al. | 257/339 |

* cited by examiner

*Primary Examiner*—Andy Huynh
(74) *Attorney, Agent, or Firm*—Robert F. Hightower (57) ABSTRACT

In one embodiment, a high voltage element is formed overlying a doped semiconductor region that can be depleted during the operation of the high voltage element.

22 Claims, 5 Drawing Sheets